United States Patent
Yang et al.

(10) Patent No.: US 9,780,337 B2
(45) Date of Patent: Oct. 3, 2017

(54) ORGANIC LIGHT-EMITTING DIODE AND MANUFACTURING METHOD THEREOF

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiuxia Yang, Beijing (CN); Feng Bai, Beijing (CN); Jiantao Liu, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/914,410

(22) PCT Filed: Jul. 28, 2015

(86) PCT No.: PCT/CN2015/085305
§ 371 (c)(1),
(2) Date: Feb. 25, 2016

(87) PCT Pub. No.: WO2016/173135
PCT Pub. Date: Nov. 3, 2016

(65) Prior Publication Data
US 2017/0047553 A1    Feb. 16, 2017

(30) Foreign Application Priority Data
Apr. 30, 2015 (CN) .......................... 2015 1 0218730

(51) Int. Cl.
*H01L 51/52* (2006.01)
*H01L 51/50* (2006.01)
(Continued)

(52) U.S. Cl.
CPC ...... *H01L 51/5275* (2013.01); *H01L 27/3248* (2013.01); *H01L 51/50* (2013.01);
(Continued)

(58) Field of Classification Search
None
See application file for complete search history.

(56) References Cited

U.S. PATENT DOCUMENTS 6,965,197 B2   11/2005  Tyan et al.
8,455,896 B2    6/2013  Kang et al.
(Continued)

FOREIGN PATENT DOCUMENTS

CN    1498046 A    5/2004
CN    1784101 A    6/2006
(Continued)

OTHER PUBLICATIONS

Chinese Office Action in Chinese Application No. 201510218730.3, mailed Jul. 25, 2016 with English translation.
(Continued)

*Primary Examiner* — Michelle Mandala
(74) *Attorney, Agent, or Firm* — Collard & Roe, P.C.

(57) ABSTRACT

An organic light-emitting diode and a manufacturing method thereof are provided. The organic light-emitting diode includes: a substrate (10) and a first light extraction layer (20), a first electrode layer (30), a light-emitting layer (40), a second electrode layer (50) and an encapsulation layer (70) that are sequentially disposed on the substrate, wherein the organic light-emitting diode further includes a second light extraction layer (60), and the second light extraction layer (60) is disposed adjacent to the encapsulation layer (70); the light-emitting layer (40) is an organic light-emitting layer and the first electrode layer (30) is an anode layer or a cathode layer and correspondingly the
(Continued)

second electrode layer (50) is a cathode layer or an anode layer.

16 Claims, 3 Drawing Sheets

(51) Int. Cl.
  *H01L 51/56* (2006.01)
  *H01L 27/32* (2006.01)
(52) U.S. Cl.
  CPC ............ *H01L 51/504* (2013.01); *H01L 51/52* (2013.01); *H01L 51/5253* (2013.01); *H01L 51/56* (2013.01); *H01L 2227/323* (2013.01); *H01L 2251/303* (2013.01); *H01L 2251/558* (2013.01)

(56) References Cited

U.S. PATENT DOCUMENTS

| | | | |
|---|---|---|---|
| 9,108,881 | B2 | 8/2015 | Vermersch et al. |
| 2003/0048072 | A1* | 3/2003 | Ishihara .............. H01L 51/5262 313/506 |
| 2008/0084159 | A1 | 4/2008 | Fery et al. |
| 2008/0218063 | A1 | 9/2008 | Greiner |
| 2011/0175513 | A1 | 7/2011 | Jeong et al. |
| 2011/0260148 | A1 | 10/2011 | Lee et al. |
| 2014/0264416 | A1 | 9/2014 | Lu |

FOREIGN PATENT DOCUMENTS

| | | |
|---|---|---|
| CN | 101080827 A | 11/2007 |
| CN | 101189745 A | 5/2008 |
| CN | 102037580 A | 4/2011 |
| CN | 102762510 A | 10/2012 |
| CN | 104218154 A | 12/2014 |
| CN | 104538419 A | 4/2015 |
| CN | 104766927 A | 7/2015 |
| EP | 2 172 991 A1 | 4/2010 |
| JP | 2013-051155 A | 3/2013 |
| JP | 5416914 B2 | 2/2014 |
| KR | 10-2011-0118277 A | 10/2011 |
| KR | 10-1468064 B1 | 12/2014 |

OTHER PUBLICATIONS

International Search Report of PCT/CN2015/085305 in Chinese, mailed Dec. 30, 2015 with English translation.
Notice of Transmittal of the International Search Report of PCT/CN2015/085305 in Chinese, mailed Dec. 30, 2015.
Written Opinion of the International Searching Authority of PCT/CN2015/085305 in Chinese, mailed Dec. 30, 2015 with English translation.
Third Chinese Office Action in Chinese Application No. 201510218730.3, dated Jun. 26, 2017 with English translation.

* cited by examiner

ORGANIC LIGHT-EMITTING DIODE AND MANUFACTURING METHOD THEREOF

CROSS REFERENCE TO RELATED APPLICATIONS

This application is the National Stage of PCT/CN2015/085305 filed on Jul. 28, 2015, which claims priority under 35 U.S.C. §119 of Chinese Application No. 201510218730.3 filed on Apr. 30, 2015, the disclosure of which is incorporated by reference.

TECHNICAL FIELD

Embodiments of the present disclosure relate to an organic light-emitting diode and a manufacturing method thereof.

BACKGROUND

An organic light-emitting diode (OLED) relates to the luminescence technology of an organic semiconductor material under the effect of electric field. The organic light-emitting diode has the advantages of active luminescence, all-solid-state, low driving voltage, high efficiency, short response, wide visual angle, simple manufacture technology and can realize a large area and flexible display, etc, so it has an extensive application prospect in the aspects of flat-panel displaying and lighting.

The performance of a single-color OLED is gradually mature. A WOLED (white organic light-emitting diodes) as a new type of solid-state light source has shown a perfect application prospect in the aspects of lighting and flat-panel displaying back-light, etc, and it has attracted more and more attentions of the people. At present, in terms of luminous efficiency, the commercial OLED has surpassed the incandescent (~10 lm/W). However, compared with the requirement that is at least 100 lm/W of the next generation of solid-state lighting (SSL), the luminous efficiency of the commercial OLED is still not enough.

SUMMARY

The present disclosure provides an OLED device with multiple light extraction layers and a manufacturing method of the OLED device. The loss of the luminous efficiency caused by the total reflection of the interior light in the device is reduced and the luminous efficiency of the organic light-emitting display device is improved effectively.

Embodiments of the present invention provide an organic light-emitting diode, which includes: a substrate and a first light extraction layer, a first electrode layer, a light-emitting layer, a second electrode layer and an encapsulation layer that are sequentially disposed on the substrate, wherein the organic light-emitting diode further comprises a second light extraction layer, and the second light extraction layer is disposed adjacent to the encapsulation layer; the light-emitting layer is an organic light-emitting layer and the first electrode layer is an anode layer or a cathode layer and correspondingly the second electrode layer is a cathode layer or an anode layer.

For example, the organic light-emitting diode further includes: a hole injection layer and a hole transport layer that are sequentially disposed between the anode layer and the light-emitting layer; and/or an electron injection layer and an electron transport layer that are sequentially disposed between the cathode layer and the light-emitting layer.

For example, the substrate is an array substrate (TFT) and the anode layer is electrically connected with the switch element of the array substrate.

For example, the first light extraction layer is made of nano-glass powder.

For example, the nano-glass powder includes ZnO, BaO and $B_2O_3$.

For example, in the nano glass powder, the mass ratio of ZnO, BaO and $B_2O_3$ is 1 to 2:1 to 5:1 to 2.

For example, the thickness of the first light extraction layer is 10 nm to 50 nm.

For example, the second light extraction layer is made of a resin material.

For example, the resin material is a light-cured resin or a heat-cured resin.

For example, the surface of the second light extraction layer has a regular texture structure.

Another embodiment of the present invention further provides a manufacturing method of the organic light-emitting diode, comprising: providing a substrate; forming a first light extraction layer, a first electrode layer, a light-emitting layer, a second electrode layer and an encapsulation layer sequentially on the substrate, wherein the method further includes disposing a second light extraction layer, and the second light extraction layer is disposed adjacent to the encapsulation layer (i.e. the second light extraction layer can be between the encapsulation layer and the second electrode layer, and also can be on the outside surface of encapsulation layer), the light-emitting layer is an organic light-emitting layer and the first electrode layer is an anode layer or a cathode layer and correspondingly the second electrode layer is a cathode layer or an anode layer.

For example, the method can also include: forming a hole injection layer and a hole transport layer between the anode layer and the light-emitting layer sequentially; and/or forming an electron injection layer and an electron transport layer between the cathode layer and the light-emitting layer sequentially.

In the above-mentioned methods, for example, forming the first light extraction layer comprises: coating a light extraction layer material on the substrate; pre-baking to remove the solvent of the coated light extraction layer material; sintering in nitrogen gas to remove the organic material.

In the above-mentioned methods, for example, the light extraction layer includes nano-glass powder.

In the above-mentioned methods, for example, the nano-glass powder includes ZnO, BaO and $B_2O_3$.

In the above-mentioned methods, for example, forming the second light extraction layer comprises: coating a resin material on the encapsulation layer by a printing process; solidifying the resin material through a heating process or an UV light curing process.

In the above-mentioned methods, for example, the resin material is a light-cured resin or a heat-cured resin.

For example, the method can also include forming a regular texture structure on the surface of the second light extraction layer.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
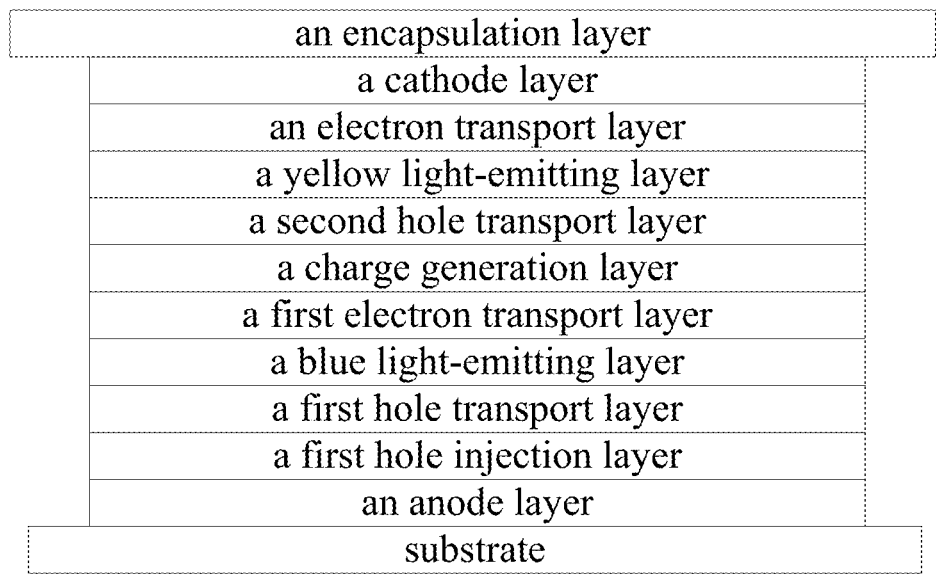
FIG. 1 is a schematic structure diagram of an OLED device.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The phrases "connect", "connected", etc., are not intended to define a physical connection or mechanical connection, but may include an electrical connection, directly or indirectly.

Unless otherwise defined, names and chemical formulas express the same meaning in the text, for example zinc oxide and ZnO, barium oxide and BaO, boron trioxide and $B_2O_3$, etc.

The luminous efficacy of the OLED device is equal to the product of the following three factors: luminous efficacy radiation (LER), electrical efficiency (EE) and external quantum efficiency (EQE). The external quantum efficiency is equal to the product of the internal quantum efficiency (IQE) and the light extraction efficiency (LEE). In the above factors, in general, the greatest room for improvement is the light extraction efficiency (LEE). Typically, the refractive indexes of the organic layer and the glass substrate are about 1.8 and about 1.5 respectively and the refractive index of the air is about 1.0. According to the Fresnel's law, because of the existing of the total internal reflection of the light in interfaces of different media, only about 20% light can be emitted from the OLED device.

Many methods have been proposed to improve the light extraction efficiency LEE by decreasing the total internal reflection of the light in interfaces, for example, microstructures in micron scale or optical gratings in nanoscale are prepared on the glass substrate, or scattering layers or diffraction optical gratings are prepared on the organic layer. But these methods focus on reducing the light travel loss on one interface of the device, although at last the LEE can be improved to some extent, the effect is limited.

The inventors of the present invention found in the study, if the light travel loss on each interface of the device is reduced as much as possible, the luminous efficiency of the OLED device can be further improved significantly.

FIG. 1 is a structure of a white OLED device, and the structure comprises: an anode layer, a first hole injection layer (HIL1), a first hole transport layer (HTL1), a blue light-emitting layer (EBML), a first electron transport layer (ETL1), a charge generation layer (CGL), a second hole transport layer (HTL2), a yellow light-emitting layer (EYML), an electron transport layer (ETL), a cathode layer and an encapsulated layer (CPL) that are sequentially disposed on the substrate.

OLED device can have types of top emission, bottom emission or double-side emission, etc. If it is disposed as a top emission type, a reflector layer would be disposed on a side of the substrate; If it is disposed as a bottom emission type, a reflector layer would be disposed on the outside of the encapsulated layer. The inventors found in the study, whether the top emission type or the bottom emission type, if only pay attention to the loss of the emitted light on the ejecting interface of the OLED would not improve the efficiency of the OLED device effectively. For example, for the top emission, if only pay attention to the loss of the interface between the CPL and the air, or for the bottom emission, if only pay attention to the loss of the interface between the substrate and the air, the efficiency of the OLED device would not be improved effectively.

The inventors of the present invention found, in the OLED the light travel loss did not only happen on one interface, the light travel loss happened on different interfaces of the device in the internal was also very big. So the light extraction layers are disposed on the two interfaces at the same time in the embodiment of the present invention to further improve the luminous efficiency of the OLED device.

Embodiment of the present invention provides an organic light-emitting diode, which includes: a substrate and a first light extraction layer, a first electrode layer, a light-emitting layer, a second electrode layer and an encapsulation layer that are sequentially disposed on the substrate. The organic light-emitting diode further comprises a second light extraction layer, and the second light extraction layer is disposed adjacent to the encapsulation layer; the light-emitting layer is an organic light-emitting layer and the first electrode layer is an anode layer or a cathode layer and correspondingly the second electrode layer is a cathode layer or an anode layer.

Figure 2:
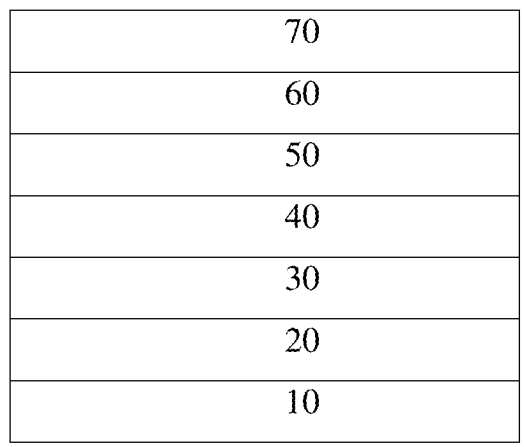
FIG. 2 is a schematic structure diagram of an OLED device in an embodiment of the present disclosure.

As shown in FIG. 2, embodiment of the present invention provides an organic light-emitting diode, which includes: a substrate 10 and a first light extraction layer 20, an anode layer 30, a light-emitting layer 40, a cathode layer 50, a second light extraction layer 60 and an encapsulation layer 70 that are sequentially disposed on the substrate from the bottom up. In another embodiment, the position relations between the second light extraction layer 60 and the encapsulation layer 70 can be switched. In another embodiment, the positions of the anode layer 30 and the cathode layer 50 can be switched.

In the embodiment of the present invention, the substrate 10 as a structural support of the organic functional layer has a certain ability to prevent water vapor and oxygen permeating and has a better surface smoothness. The substrate 10 for example can be a glass substrate, a quartz substrate, a plastic substrate, etc. A buffer layer and other layer structures can be disposed on the substrate 10, or a driving circuit has been prepared in advance, for example an active matrix driving circuit includes gate lines, data lines, power lines, thin film transistors which used as switch elements and driving components, capacitors or a passive matrix driving circuit includes gate lines, data lines and switch elements and so on. When an active matrix driving circuit is disposed on the substrate, it can also be called an array substrate or a TFT substrate, etc.

The anode layer 30 as a positive voltage connection layer of the organic light-emitting diode has good conductivity and visible light transparency and a high work function. For example, the anode layer 30 is usually made of an inorganic metal oxide (such as indium tin oxide ITO, zinc oxide ZnO, etc.) or an organic conducting polymer (such as PEDOT: PSS, PANI, etc.) or a metal material with a high work function (such as gold, copper, silver, platinum and so on). For example, the anode layer 30 can be an ITO thin film, and its square resistance for example is 25 Ω/□.

The cathode layer 50 as a negative voltage connection layer of the OLED has good conductivity and a low work function. The cathode layer 50 is usually made of a metal with a low work function such as lithium, magnesium, calcium, strontium, aluminum, indium, etc or the alloy of the metal material with a low work function and copper, gold, silver and so on.

The encapsulation layer 70 for example can be a glass layer, and it can also be a composite encapsulation layer that includes various inorganic insulator layers or a composite encapsulation layer that includes inorganic insulator layers and organic insulator layers.

For example, according to the different organic light-emitting materials the light-emitting layer 40 used, the light-emitting layer 40 can emit red light, green light, blue light, yellow light, white light and so on. The embodiment of the present disclosure is not limited to the color of the light emitted by the light-emitting layer. Besides, according to the need, organic light-emitting materials of the organic light-emitting layer in the embodiments of the disclosure include fluorescent light-emitting materials or phosphorescence light-emitting materials, and at present usually use an adopt-mixed system, that is the usable light-emitting materials are obtained by adding the doping materials to the main light-emitting materials. For example, the metal complex materials, the derivatives of anthracene, aromatic diamine compounds, triphenylamine compounds, aromatic triamine compounds, biphenyl diamine derivatives, or triarylamines polymers, etc can be used as the main light-emitting materials; More specifically, for example, double (2-methyl-8-hydroxyquinoline-N1,O8)-(1,1'-biphenyl-4-hydroxy aluminium (Balq), 9,10-di(2-naphthyl) anthracene (ADN), TAZ, 4,4'-di(9-carbazole) biphenyl (CBP), MCP, 4,4',4''-tri(9-carbazole base) triphenylamine (TCTA) or N,N-double (alpha-naphthyl-phenyl)-4,4-biphenyl diamine (NPB), etc. The fluorescent light-emitting materials or the mixed materials, for example, include coumarin dyes (coumarin 6, C-545-t), quinacridone (DMQA), or 4-(dinitrile methylene)-2-methyl-6-(4-dimethylamino-styrene)-4H-pyran (DCM) series, etc. The phosphorescence light-emitting materials or the doped materials, for example, include the metal complex luminescence materials based on the Ir, Pt, Ru, Cu metal, etc. For example: FIrpic, Fir6, FirN4, FIrtaz, Ir(ppy)$_3$, Ir(ppy)$_2$(acac), PtOEP, (btp)$_2$Iracac, Ir(piq)$_2$(acac) or (MDQ)$_2$Iracac and so on. Besides, the light-emitting materials can also include the double main body and doping material.

The first light extraction layer 20 disposed between the anode layer 30 and the the substrate 10 is made of nano-glass powder. The main components of the nano-glass powder, for example, can be ZnO, BaO and B$_2$O$_3$. The proportion of the three components is adjusted according to the refractive index of the final combination, the refractive index of the zinc oxide is 2.008 to 2.029; the refractive index of the barium oxide is 1.485 to 1.64; the refractive index of the boron trioxide is 1.98. The proportion of the three components can be adjusted to make the refractive index of the final combination between the anode layer (the refractive index is about 1.8) and the substrate (the refractive index of the substrate is about 1.5) which are adjacent to it. For example, the mass ratio of ZnO, BaO and B$_2$O$_3$ is 1 to 2:1 to 5:1 to 2. The thickness of the first light extraction layer 20 can not be particularly limited, and it can refer to the thickness of the adjacent layer. For example, the thickness of the first light extraction layer 20 is 10 nm to 50 nm, for example, 20 nm to 30 nm. Because the refractive index of the first light extraction layer 20 is between the anode layer and the substrate, the total reflection originally occurred between the anode layer 20 and the substrate 10 is greatly reduced.

Figure 4:
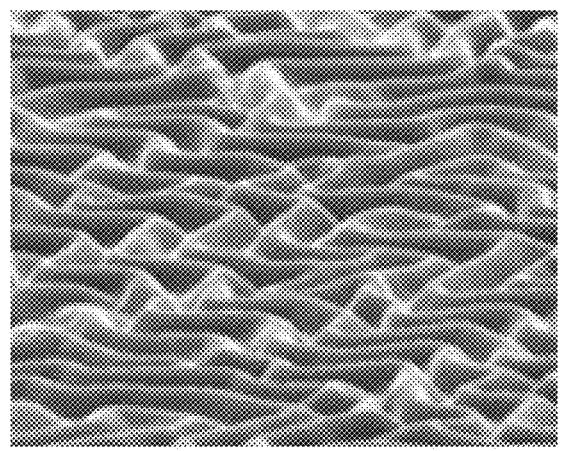
FIG. 4 is the surface morphology of the first light extraction layer of an embodiment of the present disclosure.

The second light extraction layer 60 is commonly made of a resin material, the resin materials, for example can be a light-cured resin or a heat-cured resin. The examples of the resin materials can be listed include polycarbonate (PC, the refractive index n=1.59), polyethylene terephthalate (PET, the refractive index n=1.65), polyethylene naphthalate (PEN, the refractive index n=1.78), etc. For example, a regular texture structure can be disposed on the surface of the second light extraction layer 60. An example of the surface morphology of the regular texture structure is shown in FIG. 4.

Because the refractive index of the second light extraction layer 60 is near the refractive index of the encapsulation layer 70 or the cathode layer 50 which are adjacent to it, the light emitted from the organic light-emitting layer can be transmitted to the second light extraction layer 60 and has no total reflection loss. Because of the existing of the regular texture structure which is disposed on the surface of the second light extraction layer 60, the total reflection is also greatly reduced when the light emits from the optically denser medium (for example an electrode, an encapsulation layer and an organic functional layer, etc) to the air, and then the loss of the emitting light is also reduced. Meanwhile, because the first light extraction layer 20 and the second light extraction layer 60 are existed at the same time, both the total reflection occurred on the surface of the encapsulation layer and the total reflection occurred between the anode and the substrate are greatly reduced, the loss of the light is significantly reduced when the emitting light travels in the device and at last the luminous efficiency of the OLED device is significantly improved.

Figure 3:
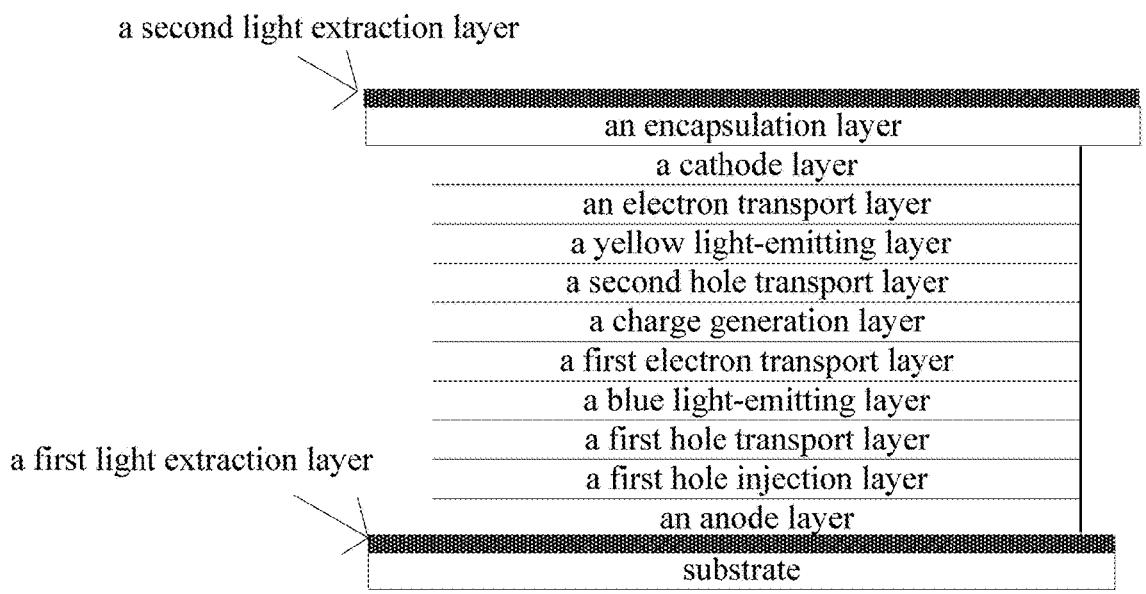
FIG. 3 is a schematic structure diagram of an OLED device in another embodiment of the present disclosure.

As shown in FIG. 3, another embodiment of the present disclosure provides a white OLED device. The device can emit white light by combining the light-emitting layers emitting light with different colors. The structure of the white OLED device includes: a substrate and a first light extraction layer, an anode layer, a first hole injection layer (HIL1), a first hole transport layer (HTL1), a blue light-emitting layer (EBML), a first electron transport layer (ETL1), a charge generation layer (CGL), a second hole transport layer (HTL2), a yellow light-emitting layer (EYML), an electron transport layer (ETL), a cathode layer and an encapsulated layer (CPL) and a second light extraction layer that are sequentially disposed on the substrate. However, the relative relation of the second light extraction layer and the encapsulated layer is not limited to the specific case showed in the FIG. 3. For example, the second light extraction layer can be disposed between the encapsulated layer and the cathode layer. Meanwhile, in an embodiment of the present disclosure, the combination of the light-emitting layer with different colors is not limited to the combination of the embodiment showed in FIG. 3 and the combination can be the other suitable combinations. The top and bottom relative positions of the blue light-emitting layer and the yellow light-emitting layer can be exchanged, and the positions of the function layers corresponding to them are also adjusted according to them.

In the case of external electric field is applied, the charge generation layer (CGL) can produce electrons and holes. The produced electrons and holes combine with the holes injected from anode and the electrons injected from cathode respectively on the light-emitting layer to emit light. The OLED device has realized high brightness, high efficiency, long life and so on at low current density, and the possibility that the laminating device is widely used in the fields of solid-state lighting and panel display. In the white OLED device, the CGL layer can plays the role of adjusting the balance of the carrier. The examples of the structure of the charge generation layer include: $Mg:Alq_3(BPhen, TPBi/MoO_3, Cs_2CO_3:Alq_3(BPhen, TPBi/MoO_3, CsN_3:Alq_3/MoO_3, Mg(Cs_2CO_3): TPBi/HAT-CN, Cs_2CO_3/Al/MoO_3$ and so on.

The hole injection layer, for example can be made of triphenylamine compounds or organic layers with p-type doped or polymers, for example: tri[4-(5-phenyl-2-thiophene) phenyl] amine, 4,4',4"-tri[2-naphthyl (phenyl) amino] triphenylamine (2-TNATA) or 4,4',4"-tri(3-methyl phenyl aniline) triphenylamine (m-MTDATA), copper phthalocyanine (CuPc), Pedot: Pss, TPD, or F4TCNQ.

The hole transport layer, for example can be made of aromatic diamine compounds, triphenylamine compounds, aromatic triamine compounds, biphenyl diamine derivatives, triarylamine polymers and carbazole polymers. Such as the NPB, TPD, TCTA and polyethylene carbazole or its monomer.

The electron transport layer, for example can be made of phenanthroline derivatives, oxazole derivatives, thiazole derivatives, imidazole derivatives, metal complexes and anthracene derivatives. The specific examples include: 8-hydroxyquinoline aluminum ($Alq_3$), 8-hydroxyquinoline lithium (Liq), 8-hydroxyquinoline gallium, double[2-(2-hydroxyl phenyl-1)-pyridinel] beryllium, 2-(4-diphenyl)-5-(4-tert-butylbenzene)-1,3,4 oxadiazoles(PBD), 1,3,5-tri(N-phenyl-2-benzimidazole-2) benzene (TPBI), BCP, Bphen, etc.

The electron injection layer, for example can be made of alkali metal oxides, alkali metal fluorides, etc. The alkali metal oxides include lithium oxide ($Li_2O$), lithium boron oxide (LiBO), potassium silicate ($K_2SiO_3$), cesium carbonate ($Cs_2CO_3$), etc. The alkali metal fluorides include lithium fluoride (LiF) and sodium fluoride (NaF), etc.

An embodiment of the present disclosure further provides a display apparatus, and the display apparatus includes the above-mentioned organic light-emitting diode which is used to form the sub-pixel having at least one color according to at least one embodiment of the present disclosure, for example, a red, a green and a blue (RGB) sub-pixel. These sub-pixels constitute a pixel array. For example, the display apparatus can be: a mobile phone, a tablet computer, a television, a monitor, a notebook computer, a digital picture frame, a navigation system, a watch and any other products or components having a display function.

Accordingly, another embodiment of the present disclosure further provides a manufacturing method of the organic light-emitting diode, and the method comprises: providing a substrate; disposing a first light extraction layer, a first electrode layer, a light-emitting layer, a second electrode layer and an encapsulation layer sequentially on the substrate. The method also includes further disposing a second light extraction layer, and the second light extraction layer is disposed adjacent to the encapsulation layer; the light-emitting layer is an organic light-emitting layer and the first electrode layer is an anode layer or a cathode layer and correspondingly the second electrode layer is a cathode layer or an anode layer.

Oxygen plasma or argon plasma can be used to preprocess the anode layer pretreatment to improve the cleanliness and surface roughness of the ITO film, to improve the surface properties and the work function values of the ITO thin film.

For example, in an example, the substrate is cleaned in the cleaning agent, the ethanol solution, the acetone solution, and the deionized water successively, and then the substrate is dried by dry nitrogen.

For example, the method can further include: forming a hole injection layer and a hole transport layer between the anode layer and the light-emitting layer sequentially; and/or forming an electron injection layer and an electron transport layer between the cathode layer and the light-emitting layer sequentially.

In an example of the embodiment, forming the first light extraction layer for example can comprise: coating a light extraction layer material on the substrate, in addition to the nano glass powder, for example, the light extraction layer material further including a cellulose resin, an adhesion promoter and a solvent; pre-baking to remove the solvent of the coated light extraction layer material, the temperature range of pre-baking, for example, being 70° C. to 120° C. and the time of pre-baking, for example, being 20 min to 30 min; sintering in nitrogen gas to remove the organic material, the temperature of sintering, for example, being 370° C. to 480° C. and the time of sintering, for example, being 40 min to 90 min.

In the method, for example, the light extraction layer includes nano-glass powder.

In the method, for example, the nano-glass powder includes ZnO, BaO and $B_2O_3$.

In another example of the embodiment of the present disclosure, forming the second light extraction layer comprises: coating a resin material on the encapsulation layer by a printing process, for example, the component of the resin includes styrene acrylic resin, solvent and additive; solidifying the resin material by a heating technology or an UV light curing technology, the technological condition of solidifying, for example, is treating in the temperature of 60° C. to 90° C. for 60~120 s.

In the method, for example, the resin material is a light-cured resin or a heat-cured resin.

For example, the method further comprises forming a regular texture structure on the surface of the second light extraction layer and the texture structure is shown in FIG. 4. The texture structure for example, can be formed in the methods of stamping, etching, lithography and so on.

In the organic light-emitting diode of the embodiment of the present disclosure, the deposition rate and the thickness of each organic functional layer, for example, can be monitored by the film thickness gauge disposed near the substrate. Besides, each of the organic functional layers can be prepared in the methods of evaporation or metal organic chemical vapor deposition (MOCVD). After that, the prepared organic light-emitting diode is transformed to the hand box to encapsulation, the hand box has an atmosphere of inert gas, for example, in the present embodiment, and the hand box has an atmosphere of nitrogen gas. After that, the photoelectric properties of the prepared organic light-emitting diode can be tested.

Figure 5:
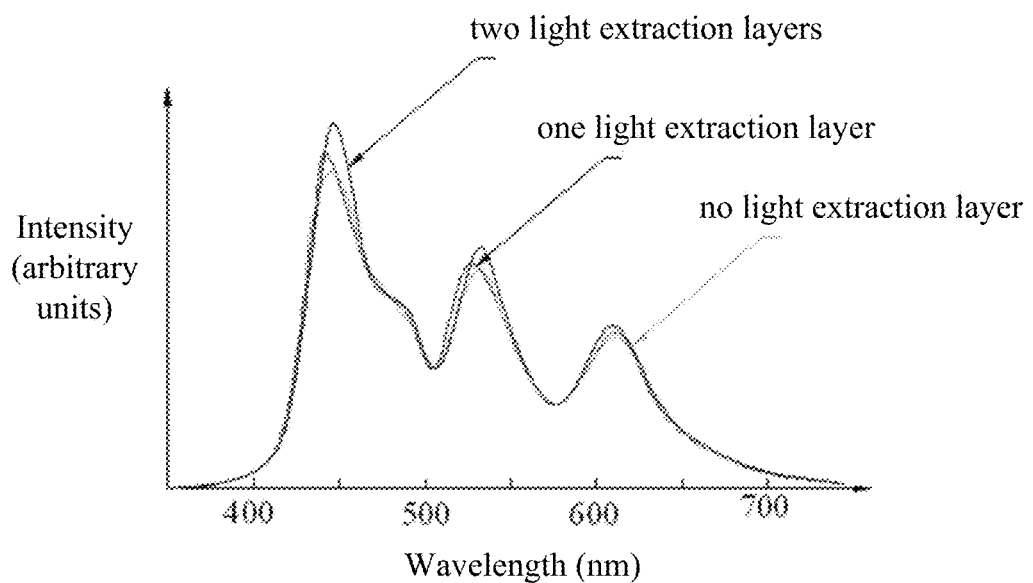
FIG. 5 is the luminescent spectrum comparison chart of the OLED in an embodiment of the present disclosure and the OLED in a contrasting example under the same conditions.

In order to illustrate the technical effects of the embodiment of the present disclosure, an OLED device having two light extraction layers is prepared in another embodiment of the present disclosure, and its structure is shown in FIG. 3. As a comparative example, an OLED device having no light extraction layer is prepared according to the same method, and its structure is shown in FIG. 1; an OLED device only having a second light extraction layer is prepared (its structure can refer to FIG. 3, in addition to the first light extraction layer is omitted, the remaining is unchanged). In addition to the above differences, the other settings (such as the materials of each layer, the thickness of each layer, the preparation method of each layer, etc.) of the structure of the three kinds of OLED devices are the same. The light-emitting spectra of the three kinds of OLED devices are tested under the same test conditions, and the results are shown in FIG. 5. It can be seen from FIG. 5 that the OLED device having no light extraction layer shows the lowest luminous efficiency. The luminous efficiency of the OLED device disposed with a second light extraction layer is improved in a certain extent, wherein the blue area is improved more obvious, yellow area is not as obvious as the blue area and the red area is not obvious. The luminous efficiency of the OLED device disposed with a first light extraction layer and a second light extraction layer at the same time is further improved, and all the luminous efficiency in the blue area, the yellow area and the red area are obviously improved, and the promotion in blue area is the most significant. It can be seen, compared with the existing OLED, the luminous efficiency of the OLED provided by the embodiment of the present disclosure which has a first light extraction layer and a second light extraction layer at the same time is significantly improved.

What are described above is related to the illustrative embodiments of the disclosure only and not limitative to the scope of the disclosure; the scopes of the disclosure are defined by the accompanying claims.

The present application claims the priority of the Chinese Patent Application No. 201510218730.3 filed on Apr. 30, 2015, the entirety of which is incorporated herein by reference as a part of the present application.

The invention claimed is:

1. An organic light-emitting diode, comprising: a substrate and a first light extraction layer, a first electrode layer, a light-emitting layer, a second electrode layer and an encapsulation layer that are sequentially disposed on the substrate,
wherein the organic light-emitting diode further comprises a second light extraction layer, and the second light extraction layer is disposed adjacent to the encapsulation layer; the light-emitting layer is an organic light-emitting layer and the first electrode layer is an anode layer or a cathode layer and correspondingly the second electrode layer is a cathode layer or an anode layer;
wherein, the first light extraction layer is made of nano-glass powder, and the second light extraction layer is made of a resin material.

2. The organic light-emitting diode according to claim 1, further comprising:
a hole injection layer and a hole transport layer that are sequentially disposed between the anode layer and the light-emitting layer; and/or
an electron injection layer and an electron transport layer that are sequentially disposed between the cathode layer and the light-emitting layer.

3. The organic light-emitting diode according to claim 1, wherein the substrate is an array substrate and the anode layer is electrically connected with a switch element of the array substrate.

4. The organic light-emitting diode according to claim 1, wherein the nano-glass powder includes ZnO, BaO and $B_2O_3$.

5. The organic light-emitting diode according to claim 4, wherein in the nano-glass powder, a mass ratio of ZnO, BaO and $B_2O_3$ is 1 to 2:1 to 5:1 to 2.

6. The organic light-emitting diode according to claim 1, wherein a thickness of the first light extraction layer is 10 nm to 50 nm.

7. The organic light-emitting diode according to claim 1, wherein the resin material is a light-cured resin or a heat-cured resin.

8. The organic light-emitting diode according to claim 1, wherein a surface of the second light extraction layer has a regular texture structure.

9. A manufacturing method of the organic light-emitting diode, comprising:
providing a substrate; and
forming a first light extraction layer, a first electrode layer, a light-emitting layer, a second electrode layer and an encapsulation layer sequentially on the substrate,
wherein the method further includes disposing a second light extraction layer, and the second light extraction layer is disposed adjacent to the encapsulation layer; the light-emitting layer is an organic light-emitting layer and the first electrode layer is an anode layer or a cathode layer and correspondingly the second electrode layer is a cathode layer or an anode layer;
wherein forming the first light extraction layer comprises:
coating a light extraction layer material on the substrate;
pre-baking to remove solvent of the coated light extraction layer material;
sintering in nitrogen gas to remove the organic material.

10. The method according to claim 9, further comprising:
forming a hole injection layer and a hole transport layer between the anode layer and the light-emitting layer sequentially; and/or
forming an electron injection layer and an electron transport layer between the cathode layer and the light-emitting layer sequentially.

11. The method according to claim 9, wherein the light extraction layer material includes nano-glass powder.

12. The method according to claim 11, wherein the nano-glass powder includes ZnO, BaO and $B_2O_3$.

13. The method according to claim 9, wherein forming the second light extraction layer comprises:
coating a resin material on the encapsulation layer by a printing process; and
solidifying the resin material through a heating process or an UV light curing process.

14. The method according to claim 13, wherein the resin material is a light-cured resin or a heat-cured resin.

15. The method according to claim 9, further comprising:
forming a regular texture structure on a surface of the second light extraction layer.

16. The organic light-emitting diode according to claim 2, wherein the substrate is an array substrate and the anode layer is electrically connected with the switch element of the array substrate.

* * * * *